United States Patent
Johnston

(10) Patent No.: US 9,820,372 B2
(45) Date of Patent: Nov. 14, 2017

(54) SEGMENTED ANTENNA ASSEMBLY

(71) Applicant: Applied Materials, Inc., Santa Clara, CA (US)

(72) Inventor: Benjamin M. Johnston, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 277 days.

(21) Appl. No.: 14/371,412

(22) PCT Filed: Jan. 11, 2013

(86) PCT No.: PCT/US2013/021246
§ 371 (c)(1),
(2) Date: Jul. 9, 2014

(87) PCT Pub. No.: WO2013/112302
PCT Pub. Date: Aug. 1, 2013

(65) Prior Publication Data
US 2015/0173166 A1    Jun. 18, 2015

Related U.S. Application Data

(60) Provisional application No. 61/591,725, filed on Jan. 27, 2012.

(51) Int. Cl.
*H05B 37/02* (2006.01)
*H05H 1/46* (2006.01)
(Continued)

(52) U.S. Cl.
CPC ............ *H05H 1/46* (2013.01); *C23C 16/511* (2013.01); *H01J 37/3222* (2013.01); *H01J 37/32192* (2013.01)

(58) Field of Classification Search
CPC .. H05H 1/46; H05H 1/34; H05H 1/38; H05H 1/54; H05H 2001/3473; H05H 2001/3494
(Continued)

(56) References Cited

U.S. PATENT DOCUMENTS 6,060,836 A * 5/2000 Maeno .................... H01J 27/18
250/423 R
6,155,199 A   12/2000 Chen et al.
(Continued)

FOREIGN PATENT DOCUMENTS

JP       06-103910      4/1994
JP    2001-126899 A    5/2001
(Continued)

OTHER PUBLICATIONS

Taiwan Office Action dated Jul. 19, 2016 for Application No. 102101522.
(Continued)

*Primary Examiner* — Douglas W Owens
*Assistant Examiner* — Amy Yang
(74) *Attorney, Agent, or Firm* — Patterson + Sheridan LLP

(57) ABSTRACT

A segmented antenna assembly for use in a plasma enhanced chemical vapor deposition (PECVD) apparatus. One embodiment provides an apparatus comprising a chamber body having a top surface and a bottom surface, an antenna comprising a first segment, a second segment electrically coupled to the first segment and extending through an interior volume of the chamber, and a third segment electrically coupled to the second segment, and a dielectric layer disposed around an outer diameter of the second segment.

11 Claims, 10 Drawing Sheets

(51) Int. Cl.
  *C23C 16/511* (2006.01)
  *H01J 37/32* (2006.01)
(58) Field of Classification Search
  USPC .......................... 315/111.41, 111.21, 111.51
  See application file for complete search history.

(56) References Cited

U.S. PATENT DOCUMENTS

| | | | |
|---|---|---|---|
| 7,011,790 B2* | 3/2006 | Ruan ...................... | A23L 3/26 |
| | | | 204/164 |
| 7,845,310 B2 | 12/2010 | DiVergilio et al. | |
| 2006/0033624 A1* | 2/2006 | Copeland ........... | G06K 19/0726 |
| | | | 340/572.7 |
| 2007/0095281 A1* | 5/2007 | Stowell ................ | C23C 16/515 |
| | | | 118/715 |
| 2008/0023146 A1* | 1/2008 | Shabalin .............. | H01J 37/321 |
| | | | 156/345.48 |
| 2009/0004874 A1* | 1/2009 | Sant ..................... | H01J 37/321 |
| | | | 438/735 |
| 2010/0215541 A1* | 8/2010 | Spitzl ............... | H01J 37/32192 |
| | | | 422/28 |
| 2010/0301012 A1 | 12/2010 | Spitzl | |
| 2011/0097518 A1 | 4/2011 | Olgado | |
| 2013/0221833 A1* | 8/2013 | Kudela ............. | H01J 37/32577 |
| | | | 313/231.31 |

FOREIGN PATENT DOCUMENTS

| | | |
|---|---|---|
| JP | 2007-067441 A | 3/2007 |
| JP | 2011-023413 A | 2/2011 |
| JP | 2011023413 A * | 2/2011 |
| TW | 200824507 A | 6/2008 |
| TW | 201202472 A | 1/2012 |
| WO | 2008/070002 A1 | 6/2008 |
| WO | 2011-041087 A2 | 4/2011 |

OTHER PUBLICATIONS

International Search Report and Written Opinion dated Jun. 27, 2013 for PCT/US2013/021246.

Japanese Office Action (with attached English translation) for Application No. 2014-554732; dated Oct. 19, 2016; 8 total pages.

* cited by examiner

SEGMENTED ANTENNA ASSEMBLY

BACKGROUND OF THE INVENTION

Field of the Invention

Embodiments of the present invention generally relate to an antenna for use in a plasma enhanced chemical vapor deposition (PECVD) apparatus.

Description of the Related Art

Chemical vapor deposition (CVD) is a process whereby chemical precursors are introduced into a processing chamber, chemically react to form a predetermined compound or material, and deposit the compound or material onto a substrate within the processing chamber. Plasma enhanced chemical vapor deposition (PECVD) is a process whereby a plasma is ignited in the chamber to enhance the reaction between the precursors.

The PECVD process may be used to process large area substrates, such as flat panel displays or solar panels. PECVD may also be used to deposit layers such as silicon based films for transistors. In general, as substrate sizes increase, the size of components within the chamber must be increased. For large area substrates, servicing and maintaining the radio frequency (RF) hardware used to ignite the plasma within the chamber can be quite cumbersome. For example, in conventional systems, the plasma source typically includes a microwave antenna which spans the height of the processing chamber. Additionally, this antenna may form connections with a number of internal and external chamber components. Accessing and replacing RF hardware components such as the antenna may require the disassembly of multiple chamber components, resulting in extended downtime and decreased throughput. For example, in conventional systems, the removal and replacement of the antenna requires that the antenna be disconnected from the microwave launcher assemblies, a process which necessitates the disassembly of multiple RF components. Therefore, there is a need for enabling RF hardware components to be disassembled and serviced in a simple and efficient manner.

SUMMARY OF THE INVENTION

The present invention generally provides a segmented antenna assembly for use in a plasma enhanced chemical vapor deposition (PECVD) apparatus. In one aspect, an apparatus comprises a chamber body having a top surface and a bottom surface, an antenna comprising a first segment, a second segment electrically coupled to the first segment and extending through an interior volume of the chamber, and a third segment electrically coupled to the second segment, and a dielectric layer disposed around an outer diameter of the second segment.

In another aspect, an apparatus comprises a chamber body having a top surface and a bottom surface, an antenna comprising a first segment, a second segment electrically coupled to the first segment and extending through an interior volume of the chamber, and a third segment electrically coupled to the second segment, a dielectric layer disposed around an outer diameter of the second segment, a first microwave launcher assembly disposed on the top surface of the chamber body and electrically coupled to the first segment of the antenna, and a second microwave launcher assembly disposed on the bottom surface of the chamber body and electrically coupled to the third segment of the antenna.

In another aspect, an apparatus comprises a chamber body having a top surface and a bottom surface, an antenna comprising a first segment, a second segment electrically coupled to the first segment and extending through an interior volume of the chamber, and a third segment electrically coupled to the second segment, and a dielectric layer disposed around an outer diameter of the second segment, wherein the antenna comprises a hollow electrically conductive tube adapted to transport a cooling fluid, the hollow electrically conductive tube has an outer diameter of about 0.3 inches to 0.5 inches, and the dielectric layer comprises alumina.

In another aspect, an apparatus comprises a chamber body having a top surface and a bottom surface, an antenna comprising a first segment, a second segment electrically coupled to the first segment and extending through an interior volume of the chamber, and a third segment electrically coupled to the second segment, a dielectric layer disposed around an outer diameter of the second segment, a first coupling body connecting the second segment to the first segment, and a second coupling body connecting the second segment to the third segment, wherein the first and second coupling bodies comprise a threading and gasket connection.

In another aspect, an antenna assembly comprises a first hollow tube, the first hollow tube being electrically conductive, a dielectric layer disposed around the first hollow tube, a first coupling body on a first end of the first hollow tube, the first coupling body configured to form an electrical and fluid connection with a second hollow tube, and a second coupling body on a second end of the first hollow tube, the second coupling body configured to form an electrical and fluid connection with a third hollow tube.

In another aspect, an antenna assembly comprises a first hollow tube, the first hollow tube being electrically conductive, a dielectric layer disposed around the first hollow tube, a first coupling body on a first end of the first hollow tube, the first coupling body configured to form an electrical and fluid connection with a second hollow tube, and a second coupling body on a second end of the first hollow tube, the second coupling body configured to form an electrical and fluid connection with a third hollow tube, wherein the first coupling body comprises a first threading surface configured to couple the first coupling body to the second hollow tube, and the second coupling body comprises a second threading surface configured to couple the second coupling body to the third hollow tube.

In yet another aspect, an antenna assembly comprises a first hollow tube, the first hollow tube being electrically conductive, a dielectric layer disposed around the first hollow tube, a first coupling body on a first end of the first hollow tube, the first coupling body configured to form an electrical and fluid connection with a second hollow tube, and a second coupling body on a second end of the first hollow tube, the second coupling body configured to form an electrical and fluid connection with a third hollow tube, wherein the first hollow tube comprises a hollow copper tube, and the first hollow tube and the dielectric layer are configured to generate plasma in a processing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention generally provides a segmented antenna assembly for use in a plasma enhanced chemical vapor deposition (PECVD) apparatus. Antenna segmentation permits portions of the antenna to be serviced or replaced without requiring removal of the entire antenna. If breakage of the dielectric layer surrounding the antenna occurs, the relevant segment(s) of the antenna may be removed from the chamber without complete disassembly of the microwave launcher assemblies or other chamber components. Other beneficial aspects of the segmented antenna include a reduction in the ceiling height requirements of the facilities in which the processing chamber operates and the ability to individually remove portions of the antenna required to service or replace the microwave launcher assemblies without opening the processing chamber to remove the entire antenna. By permitting antenna segments to be individually removed, labor and materials costs associated with servicing the antenna may be significantly decreased, and the time required to service the antenna may be reduced, decreasing chamber downtime and increasing throughput.

While the particular apparatus within which the embodiments described herein can be practiced is not limited, it is particularly beneficial to practice the embodiments in a vertical CVD chamber, such as those available from Applied Materials, Inc., Santa Clara, Calif. It is to be understood that the embodiments may be practiced in other systems as well, including those sold by other manufacturers.

Figure 1:
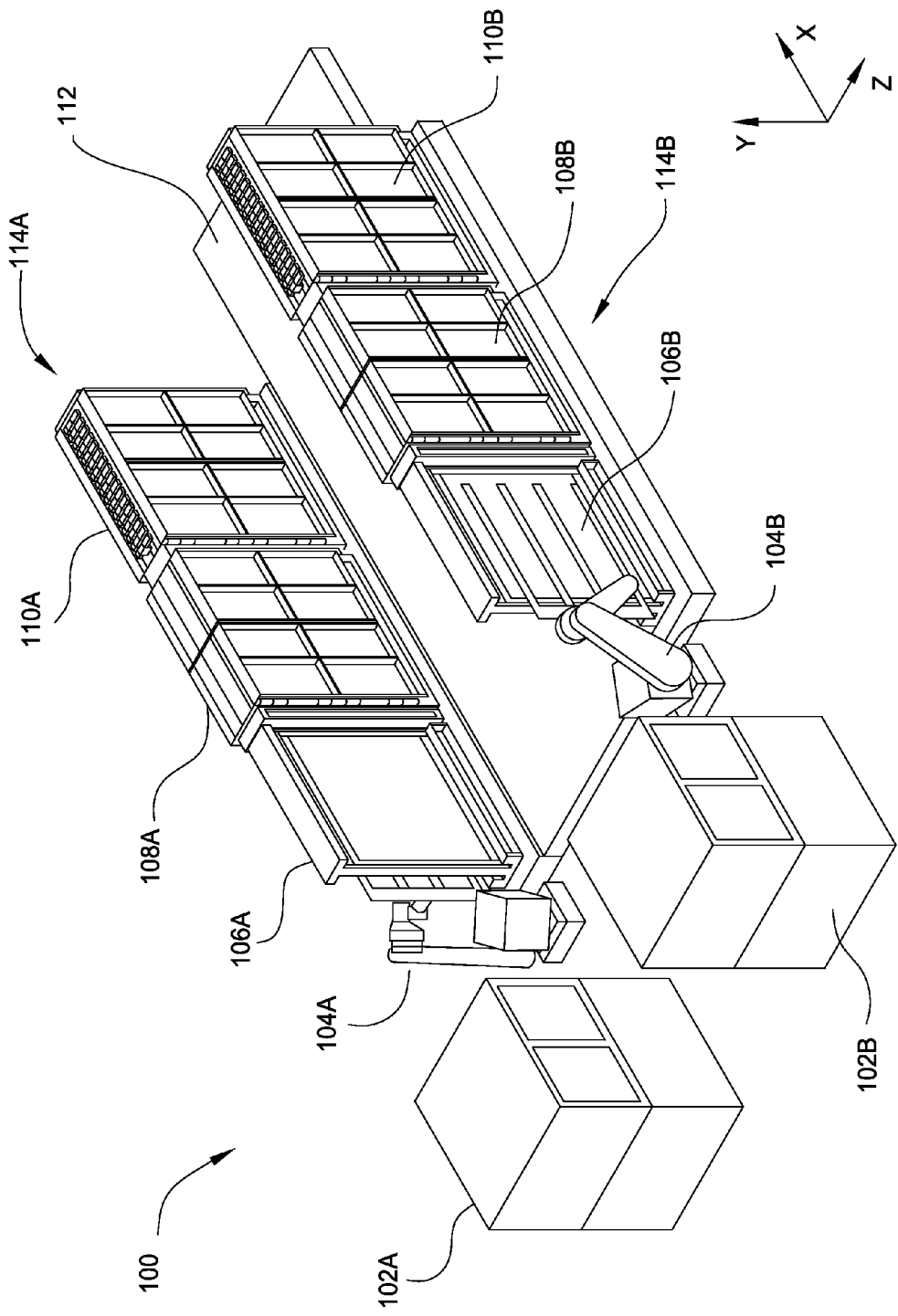
FIG. 1 is a schematic view of a vertical, linear CVD system 100 according to one embodiment.

FIG. 1 is a schematic view of a vertical, linear CVD system 100 according to one embodiment. The system 100 preferably includes two separate process lines 114A, 114B coupled together by a common system control platform 112 to form a twin process line configuration/layout. A common power supply (such as an AC power supply), common and/or shared pumping and exhaust components and a common gas panel may be used for the twin process lines 114A, 114B. It is also contemplated that the system may be configured using a single process line or more than two process lines.

Each processing line 114A, 114B includes a substrate stacking module 102A, 102B from which fresh substrates—substrates which have not yet been processed within the system 100—are retrieved and processed substrates are stored. Atmospheric robots 104A, 104B retrieve substrates from the substrate stacking modules 102A, 102B and place the substrates into a dual substrate loading station 106A, 106B. The fresh substrates are then moved into dual substrate load lock chambers 108A, 108B and then to a dual substrate processing chamber 110A, 110B. Each processed substrate returns through one of the dual substrate load lock chambers 108A, 108B to one of the dual substrate loading stations 106A, 106B, where it is retrieved by one of the atmospheric robots 104A, 104B and returned to one of the substrate stacking modules 102A, 102B.

Figure 2A:
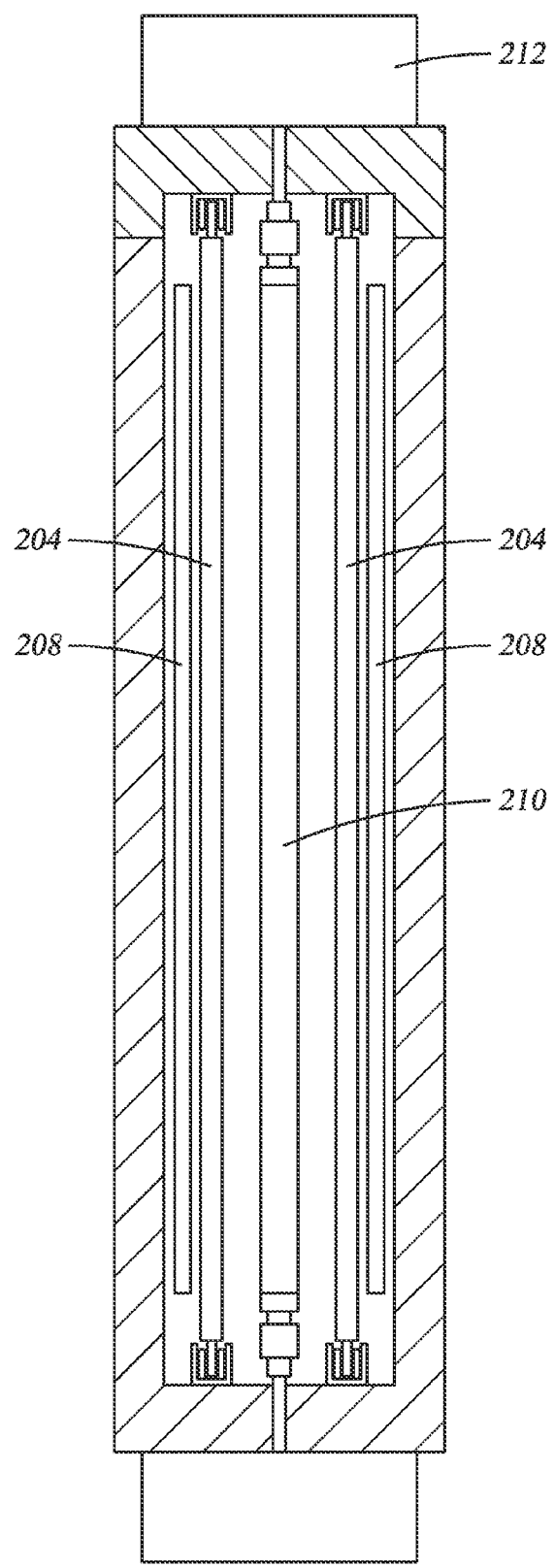
FIG. 2A is a schematic elevation view of dual processing chambers 110A, 110B according to one embodiment.

FIG. 2A is a schematic elevation view of dual processing chambers 110A, 110B according to one embodiment. The dual processing chambers 110A, 110B include a plurality of antennas 210 disposed in a linear arrangement in the center of each processing chamber 110A, 110B. The antennas 210 extend vertically from a top of the processing chamber to a bottom of the processing chamber. Each antenna 210 has a corresponding microwave power head 212 at both the top and the bottom of the processing chamber that is coupled to the antenna 210.

Figure 2B:
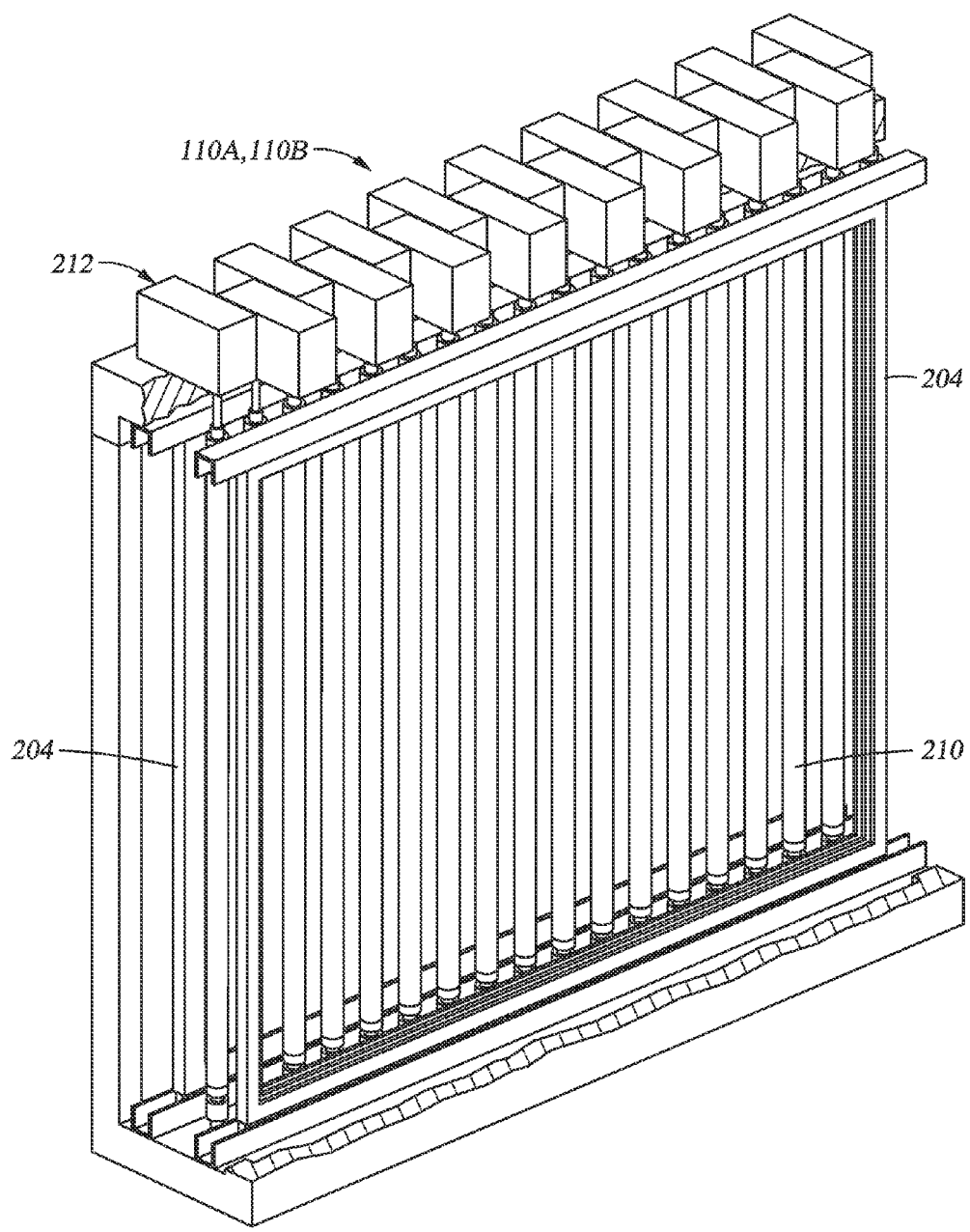
FIG. 2B is a schematic perspective view of dual processing chambers 110A, 110B according to one embodiment.

FIG. 2B is a schematic perspective view of dual processing chambers 110A, 110B according to one embodiment. The dual processing chambers 110A, 110B include a shadow frame 204, a plurality of antennas 210, and a plurality of microwave power heads 212. As shown in FIG. 2B, the microwave power heads 212 are staggered. The staggering may be due to space limitations. Power may be independently applied to each end of the antenna 210 through each power head 212. The antennas 210 may operate at a frequency within a range of about 300 MHz to 300 GHz.

Figure 2C:
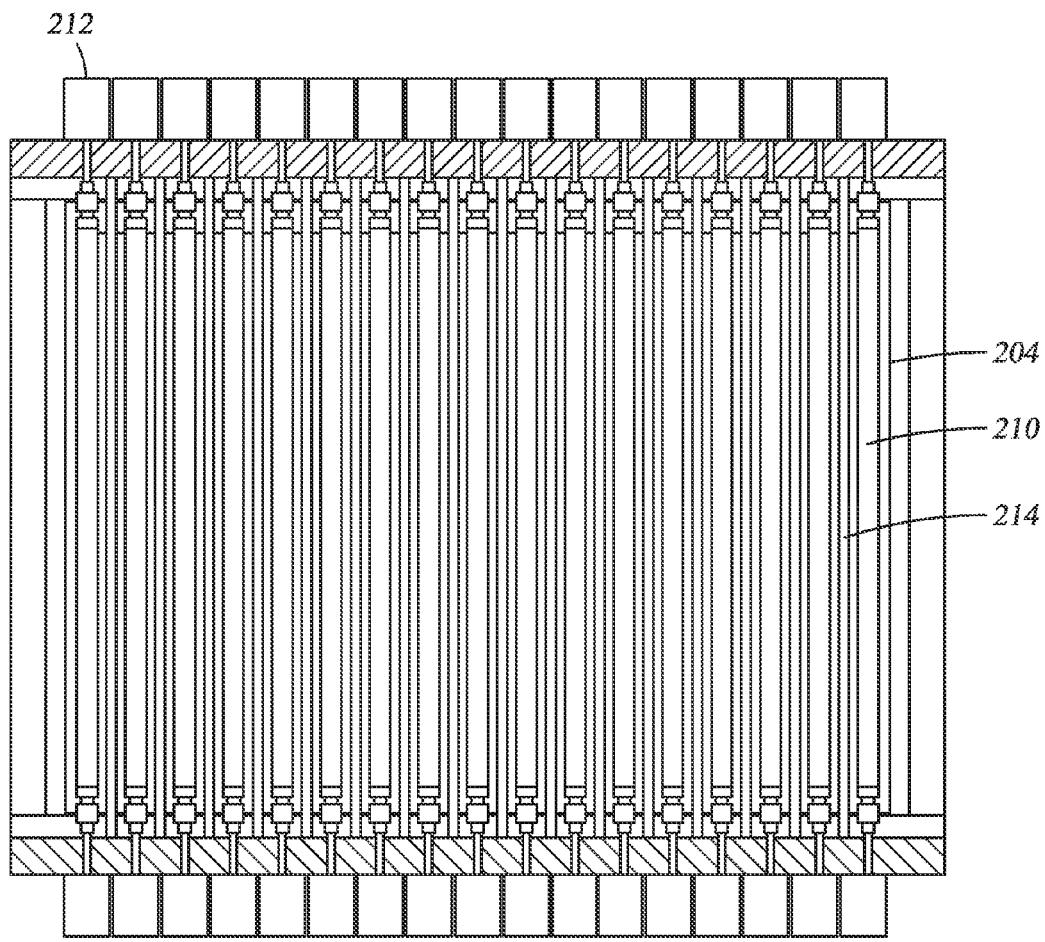
FIG. 2C is a schematic elevation view of dual processing chambers 110A, 110B according to one embodiment.

FIG. 2C is a schematic elevation view of dual processing chambers 110A, 110B according to one embodiment. The dual processing chambers 110A, 110B include a shadow frame 204, a plurality of antennas 210, a plurality of microwave power heads 212, and a plurality of gas introduction tubes 214. The gas introduction tubes 214 are disposed between adjacent antennas 210 and permit the introduction of processing gases, such as silicon precursors and nitrogen precursors. The gas introduction tubes 214 extend vertically from the bottom to the top of the processing chamber and are parallel to the antennas 210.

Figure 2D:
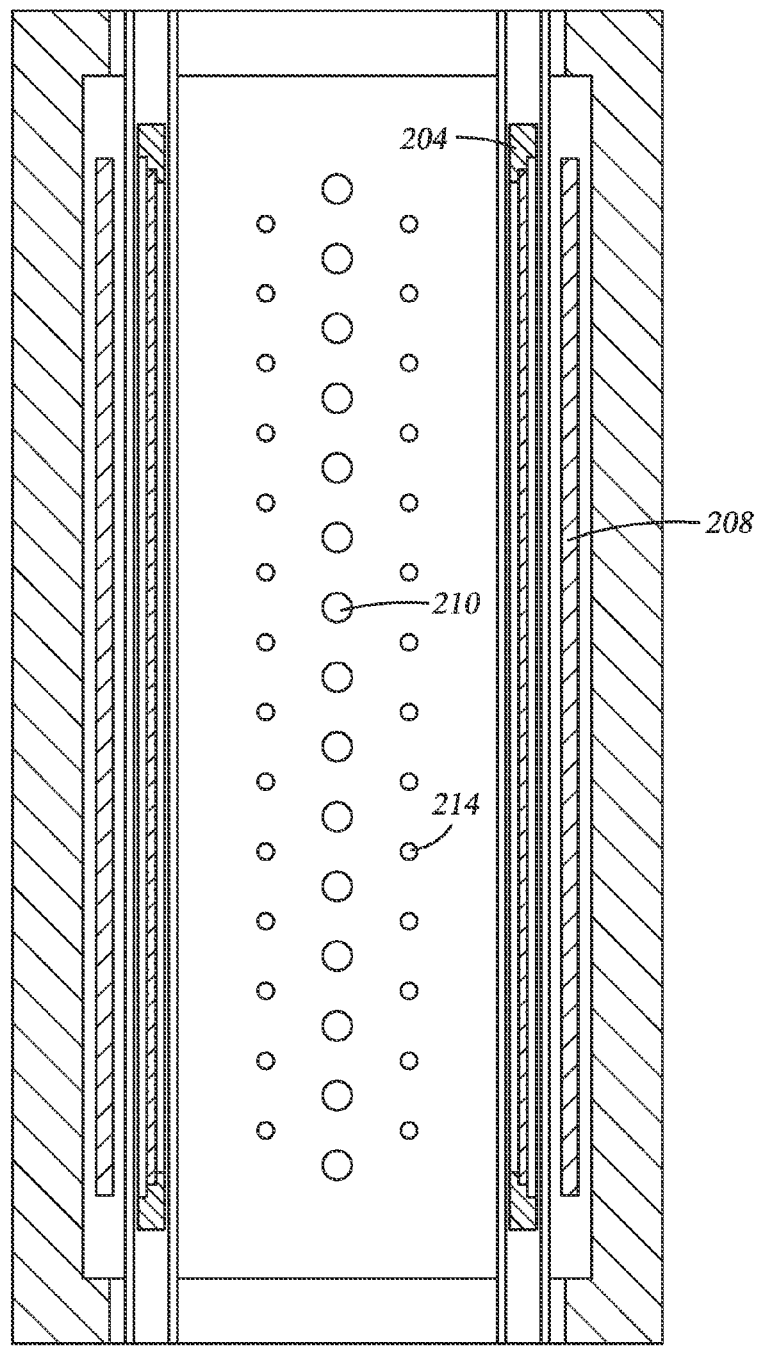
FIG. 2D is a top view of dual processing chambers 110A, 110B according to one embodiment.

FIG. 2D is a top view of dual processing chambers 110A, 110B according to one embodiment. FIG. 2D shows the layout of the antennas 210, gas introduction tubes 214, shadow frames 204, and platens 208 within the processing chamber 110A, 110B. The antennas 210 are centrally located within the processing chamber 110A, 110B. The platens 208 and shadow frames 204 are disposed on opposite sides of the antennas 210. The gas introduction tubes 214 are disposed between the antennas 210 and the shadow frames 204. The number of gas introduction tubes 214 present on each side of the centrally located antennas 210 is equal. Each of the gas introduction tubes 214 has a diameter that is between about 0.25 inches and about 0.625 inches. Each of the processing chambers is capable of processing two substrates, one on each side of the antennas 210. The substrates are held in place within the processing chamber by a platen 208 and a shadow frame 204. While not shown in FIGS. 2A-2D, the processing chambers 110A, 110B may be evacuated through a pumping port located behind the substrate carriers.

Figure 3A:
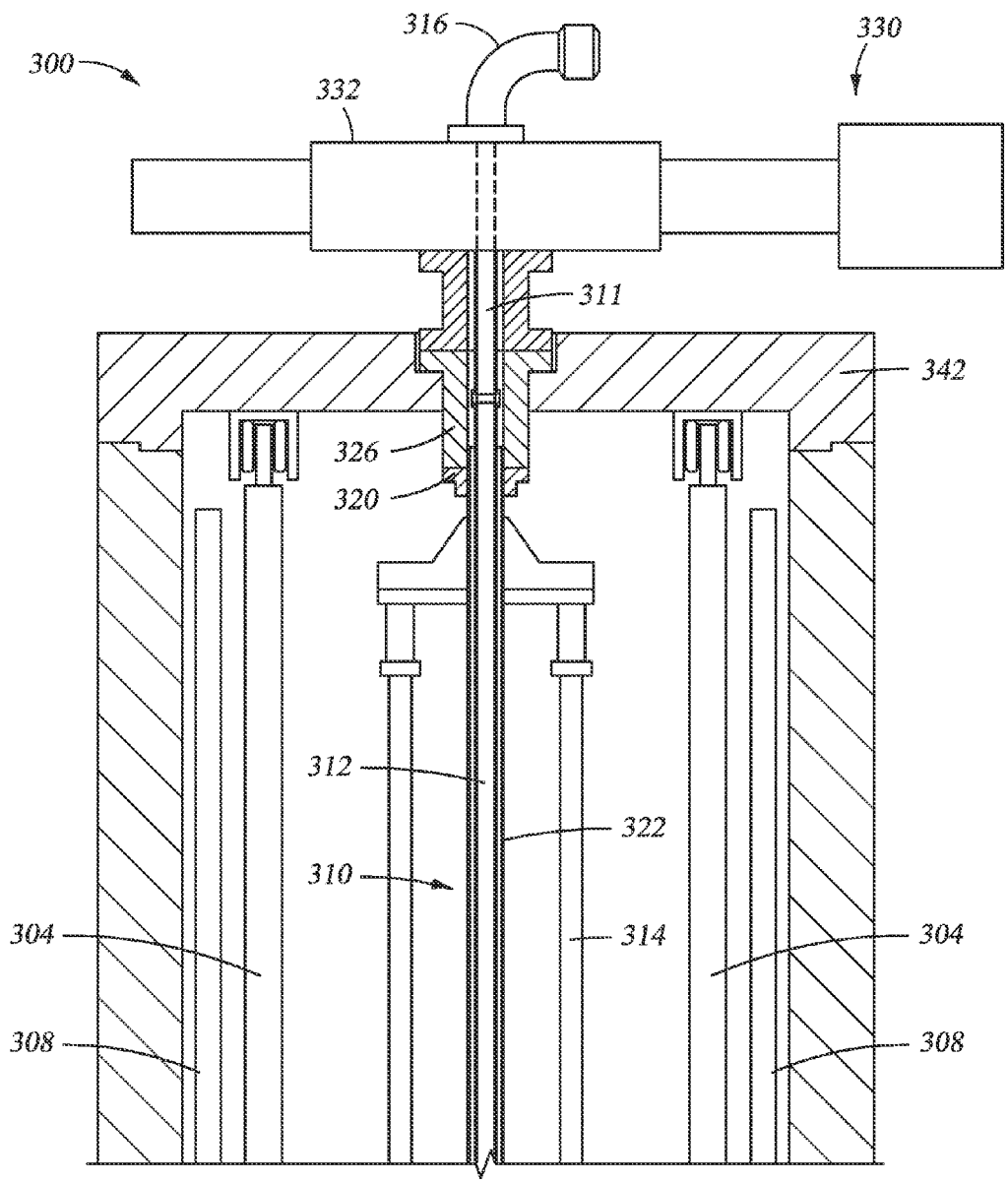
FIGS. 3A and 3B are schematic cross-sectional views of a dual processing chamber 300 according to one embodiment.
Figure 3B:
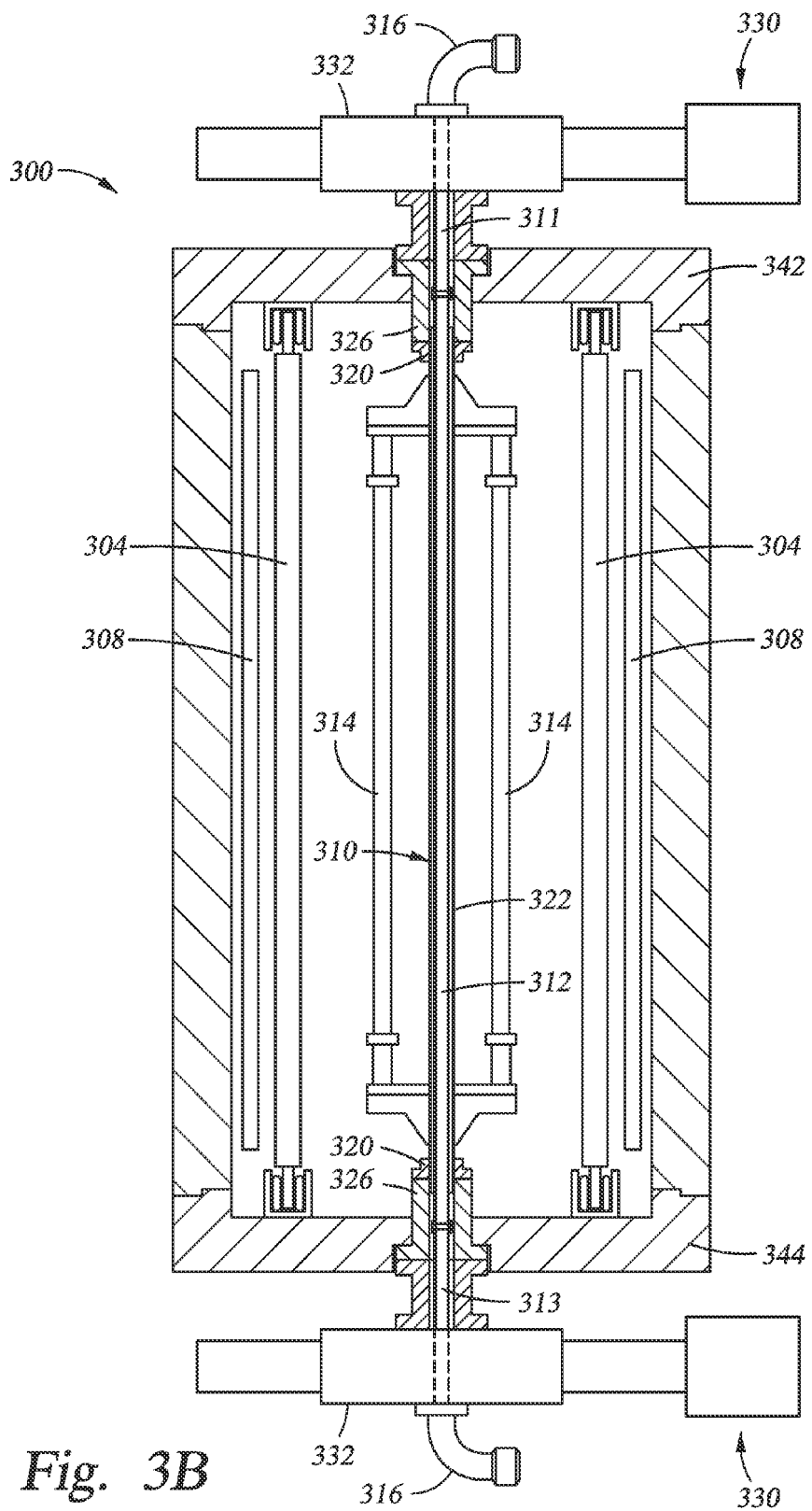

FIGS. 3A and 3B are schematic cross-sectional views of a dual processing chamber 300 according to one embodiment. The dual processing chamber 300 includes shadow frames 304, platens 308, a plurality of antennas 310, a plurality of gas introduction tubes 314, and microwave launcher assemblies 330. Each antenna 310 includes a first segment 311, a second segment 312, a third segment 313, and a dielectric layer 322. Each of the first, second, and third segments 311, 312, 313 include a hollow, cylindrical, electrically conductive body through which a cooling fluid may flow. The first and third segments 311, 313 of the antenna 310 are electrically and fluidly coupled to the ends of the second segment 312. The dielectric layer 322 is disposed around the second segment 312 and coupled to the second segment 312 by a plurality of spacers 420. The spacers 420 are positioned such that a fluid may flow in a channel formed between the outer diameter of the second segment 312 and the inner diameter of the dielectric layer 322. Each microwave launcher assembly 330 includes a microwave power head 332, a feed through 326, and an end cap 320.

Each of the plurality of antennas 310 extends vertically from a top of the processing chamber 342 to a bottom of the processing chamber 344. The first segment 311 of each antenna 310 extends through a microwave launcher assembly 330 coupled to the top of the processing chamber 342, and the third segment 313 of each antenna 310 extends through a microwave launcher assembly 330 coupled to the bottom of the processing chamber 344. A second segment 312 of the antenna 310 extends vertically between each feed through 326 of each microwave launcher assemblies 330. The end cap 320 of the microwave launcher assembly 330 may form a vacuum seal between the feed through 326 and the dielectric layer 322 disposed around the second segment 312 of the antenna 310. The microwave launcher assembly 330 may include a coaxial waveguide which couples and transmits microwave energy generated by the microwave launcher assembly 330 to the antenna 310.

The first segment 311 may be connected to the second segment 312 at a location within the internal dimensions of the chamber to enable the first and second segments 311, 312 to be disconnected from one another without requiring the removal of the corresponding microwave launcher assembly 330. Additionally, the second segment 312 may be connected to the third segment 313 at a location within the internal dimensions of the chamber to enable the second and third segments 312, 313 to be disconnected from one another without requiring the removal of the corresponding microwave launcher assembly 330. In one embodiment, the first segment 311 is coupled to the second segment 312 and the second segment 312 is coupled to the third segment 313 at locations in which plasma is not generated. By forming connections between the antenna segments outside of the plasma generation zone, deleterious effects, such as arcing and poor plasma uniformity, may be avoided.

The segmented antenna 310 permits portions of the antenna to be serviced or replaced without requiring removal of the entire antenna 310. By segmenting the antenna 310, the manufacturability of the antenna is increased, and the costs associated with antenna fabrication are decreased. Should breakage of the dielectric layer 322 occur, the second segment 312 may be removed from the chamber without requiring the first and third segments 311, 313 to be disconnected from the microwave launcher assemblies 330.

During plasma generation, the antenna 310 produces heat which, if not removed from the system, may cause damage to components within the dual processing chamber 300. In order to cool the antenna 310, the antenna may include a hollow conductive tube through which a cooling fluid may flow. For example, the antenna 310 may include a hard drawn, hollow copper tube having an outer diameter of about 0.25 inches to 1 inch. For example, the outer diameter may be about 0.3 inches to 0.5 inches. A fitting 316 is in fluid connection with one end of each of the first and third segments 311, 313. In operation, a fluid reservoir may be placed in fluid connection with one or more of the fittings 316, and a fluid, such as water, may flow through and cool the antenna 310. To facilitate the flow of a cooling liquid through the antenna 310, a fluid tight seal may be formed between each of the segments 311, 312, 313. Such a seal may be accomplished by a threading and gasket seal formed between two segments. Other techniques known to those of skill in the art for forming a fluid tight seal between the segments 311, 312, 313 are also within the scope of the application.

Additionally, a fluid may flow between the dielectric layer 322 and the outer diameter of the antenna 310 to cool the first, second, and/or third segments 311, 312, 313 of the antenna 310. The cooling fluid may be an inert gas, such as nitrogen. The formation of a vacuum seal between each end cap 320 of the microwave launcher assembly 330 and the dielectric layer 322 allows the cooling fluid to flow between the dielectric layer 322 and the antenna 310 without affecting vacuum conditions in the processing chamber.

Replacement of the second segment may be accomplished by draining the cooling fluid from the antenna 310. Each end cap 320 may include a flexible gasket which enables a vacuum seal to be formed between the end caps 320 and the dielectric layer 322 without damaging or cracking the dielectric layer 322. Accordingly, the side of the dual processing chamber 300 may be opened, and the seal between the end caps 320 and the dielectric layer 322 may be broken. The end caps 320 may be removed from the feed throughs 326, for example, by unbolting the end caps 320 from the feed throughs 326. The ends of the second segment 312 may then be disconnected from the first and third segments 311, 313. Disconnecting the first and third segments 311, 313 from the ends of the second segment 312 may include unscrewing a coupling body 412, shown in FIG. 4, which forms an electrical and/or fluid connection between the first segment 311 and the second segment 312 and the third segment 313 and the second segment 312. The second segment 312 may then be removed and replaced without requiring the removal of the first or third segments 311, 313. This configuration reduces the ceiling height requirements of the facilities in which the dual processing chamber 300 operates. That is, replacement of a non-segmented antenna may require removal of the antenna through the top of the processing chamber 342 and may necessitate a ceiling height of 8 to 10 meters.

The first segment 311 and the third segment 313 of the antenna 310 may be capable of rotation when the segments are coupled to the microwave launcher assemblies 330. Enabling rotation of the first and third segments 311, 313 may facilitate coupling of the second segment 312 to the first and third segments 311, 313. In such a configuration, the second segment 312 may be inserted between the first and third segments 311, 313, and the first and third segments 311, 313 may be individually rotated to form threading connections with the second segment 312.

Other beneficial aspects of the segmented antenna 310 include the ability to disconnect the first and third segments 311, 313 from the second segment 312, for example, to enable the microwave launcher assemblies 330 to be serviced. Removal or replacement of the first and third segments 311, 313 may be accomplished without opening or breaking the vacuum of the dual processing chamber 300, and without requiring the end caps 320 to be disconnected from the dielectric layer 322 and/or feed throughs 326. By permitting antenna segments to be individually removed, labor and materials costs associated with servicing the antenna may be significantly decreased. Additionally, the time required to service the antenna may be reduced, decreasing chamber downtime and associated operational costs.

During operation of the antenna 310, radio frequency signals are transmitted from the microwave launcher assemblies 330, through the first and third segments 311, 313, to the second segment 312. The dielectric layer 322, disposed around the outer diameter of the second segment 312, then facilitates the formation of a plasma in the dual processing chamber 300. The dielectric layer 322 may extend to the ends of the second segment 312, or the dielectric layer 322 may be shorter than the second segment 312, leaving the ends of the second segment 312 exposed for connection to the first and third segments 311, 313. In other embodiments, the dielectric layer 322 may be disposed around the outer diameter of the first, second, and/or third segments 311, 312, 313. The dielectric layer 322 may include a ceramic material, such as alumina. The dielectric layer 322 may be a tube disposed around the outer diameter of the antenna 310, such that the inner diameter of the dielectric layer 322 is greater than the outer diameter of the antenna 310. In such a configuration, spacers may be disposed between the outer diameter of the antenna 310 and the inner diameter of the dielectric layer 322 to center the antenna in the dielectric layer 322. The spacers may include an inert material and/or electrically insulating material such as polytetrafluoroethylene (PTFE). In exemplary embodiments, the dielectric layer 322 may have any outer diameter of approximately 32 millimeters to 38 millimeters (e.g., 35 millimeters) and an inner diameter of approximately 25 millimeters to 30 millimeters.

The lengths of the first and third segments 311, 313 of the antenna 310 may be shorter than the length of the second segment 312, which extends across the internal volume of the dual processing chamber 300. Additionally, the lengths of the segments may depend upon the size of the chamber in which they are used. For example, in one particular chamber size, the first and third segments 311, 313 may be approximately 1 to 2 meters in length, while the second segment 312 may be approximately 3 to 5 meters in length. For example, the second segment 312 may have a length of about 3 to 3.5 meters in length. However, a second segment 312 for use in a smaller chamber may have a length of approximately 1 meter to 3 meters. For example, the second segment 312 may have a length of approximately 2 meters. In other embodiments, each of the segments may be equal in length, or the lengths of the first and third segments 311, 313 may be greater than the length of the second segment 312.

An antenna 310 which includes more than three segments, such as four or more segments, is also within the scope of the application. For example, the portion of the antenna 310 which extends across the internal volume of the chamber 300 may include more than one segment. Such a configuration may reduce the cost of replacing a segment of the antenna, for example, if the dielectric layer 322 should crack. In another embodiment, portions of the antenna which extend outside of the dual processing chamber 300 may include more than one segment. In other embodiments, the antenna 310 may be segmented such that each component of the dual processing chamber 300 may be individually serviced or replaced without requiring the disassembly of other chamber components.

Figure 4A:
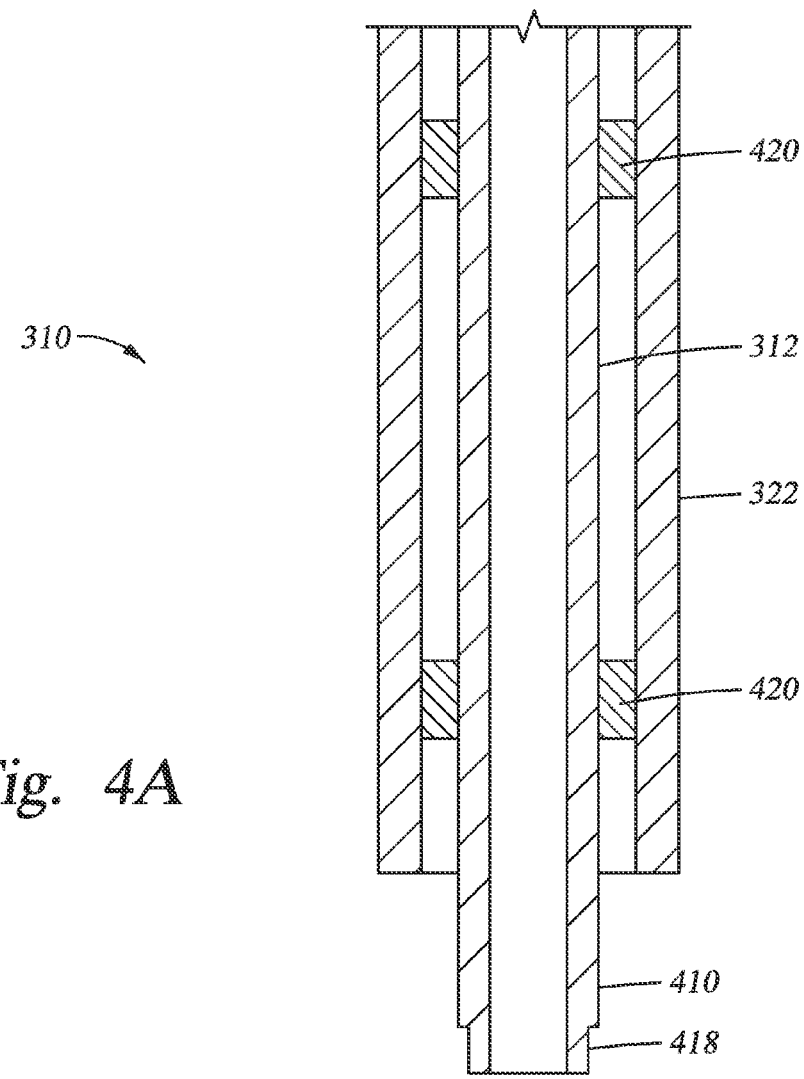
FIG. 4A is a partial schematic cross-sectional representation of an antenna 310 according to one embodiment.

FIG. 4A is a partial schematic cross-sectional view of an antenna 310 according to one embodiment. The antenna 310 includes a first segment 311, a second segment 312, and a dielectric layer 322. The first segment 311 includes a coupling body 412 having a first threading surface 414 and a gasket 416. The second segment 312 includes an exposed end 410 having a second threading surface 418. Spacers 420 are disposed between the outer diameter of the second segment 312 and the inner diameter of the dielectric layer 322.

An electrical and/or fluid connection may be established between the first and second segments 311, 312 by coupling the first threading surface 414 to the second threading surface 418. Upon coupling the first and second segments 311, 312, the gasket 416 may be seated against the end of the second segment 312, enhancing the water tight seal between the segments. The gasket 416 may include an o-ring composed of a material which compresses to form a water tight seal, yet is capable of withstanding the high temperatures produced during plasma generation.

In other embodiments, the first and/or third segments 311, 313 may be coupled to the second segment 312 by threading surfaces in various configurations. For example, the first or third segment 311, 313 may include a threading surface formed on the internal diameters of the segment, and the second segment 312 may include a threading surface formed on an external diameter of the segment, such that the second segment 312 may be inserted into the first or third segments 311, 313 and rotated to couple the threading surfaces. Alternatively, the threading surfaces may be formed on an external diameter of the first and third segments 311, 313 and on an internal diameter of the second segment 312. Such configurations may include the use of gaskets or compression fittings to ensure water tight seals, or such configurations may not include gaskets or compression fittings.

Each spacer 420 may be disposed around the entire circumference of the antenna 310, or multiple spacers 420 may be placed at various positions around the circumference of the antenna 310 to permit a fluid to flow between the antenna 310 and the dielectric layer 322. For example, two spacers 420 may be positioned on either side of the outer diameter of the antenna 310, or three or more spacers 420 may be equally spaced around the outer diameter of the antenna 310, to form a fluid channel between the outer diameter of the antenna 310 and the inner diameter of the dielectric layer 322. The fluid channel may extend along the length of the dielectric layer 322.

Figure 4B:
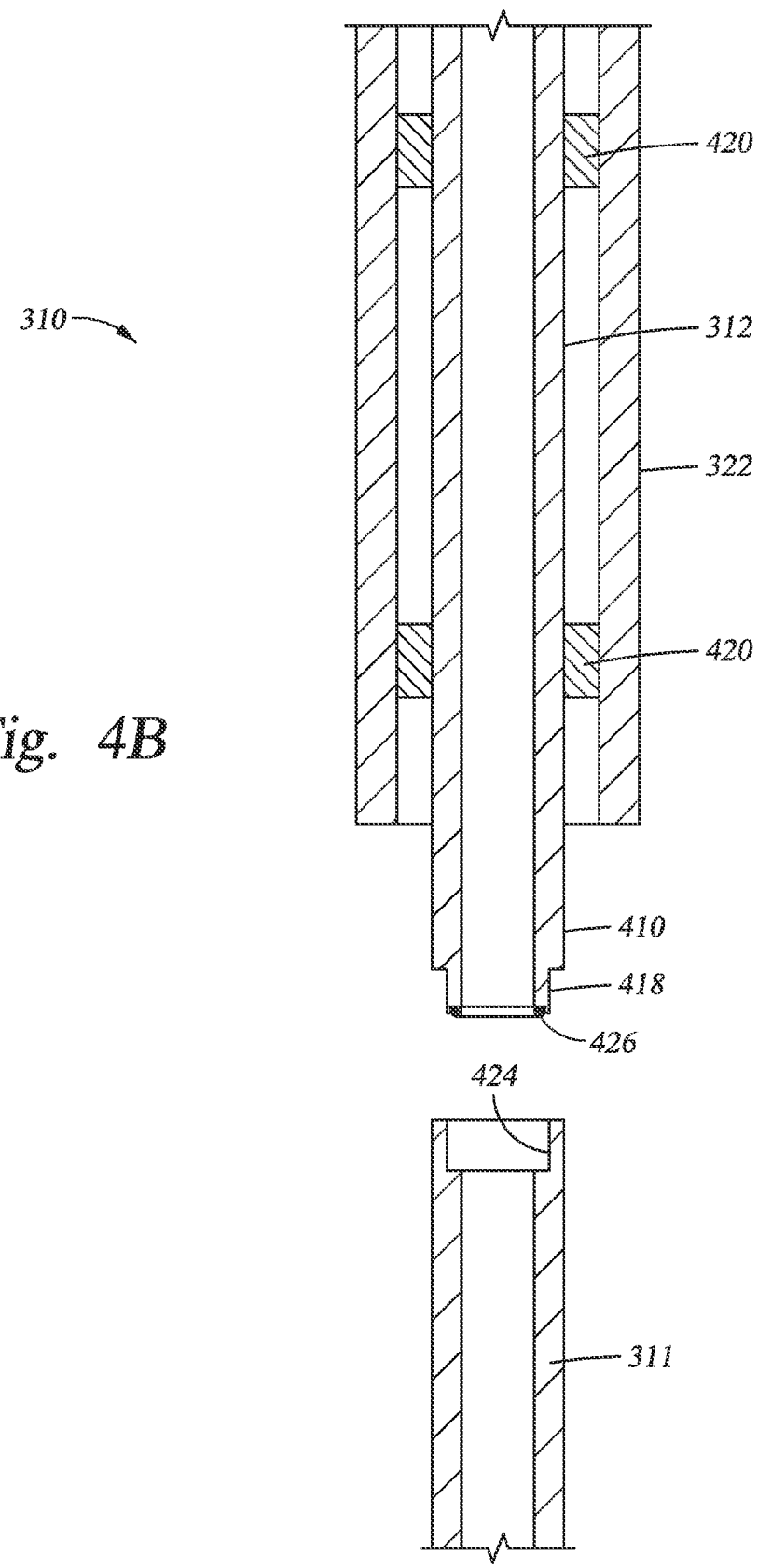
FIG. 4B is a partial schematic cross-sectional representation of an antenna 310 according to one embodiment.

FIG. 4B is a partial schematic cross-sectional view of an antenna 310 according to one embodiment. The antenna 310 includes a first segment 311, a second segment 312, and a dielectric layer 322. The first segment 311 includes a first threading surface 424. The second segment 312 includes an exposed end 410 having a second threading surface 428 and a gasket 426. Spacers 420 are disposed between the outer diameter of the second segment 312 and the inner diameter of the dielectric layer 322.

Figure 4C:
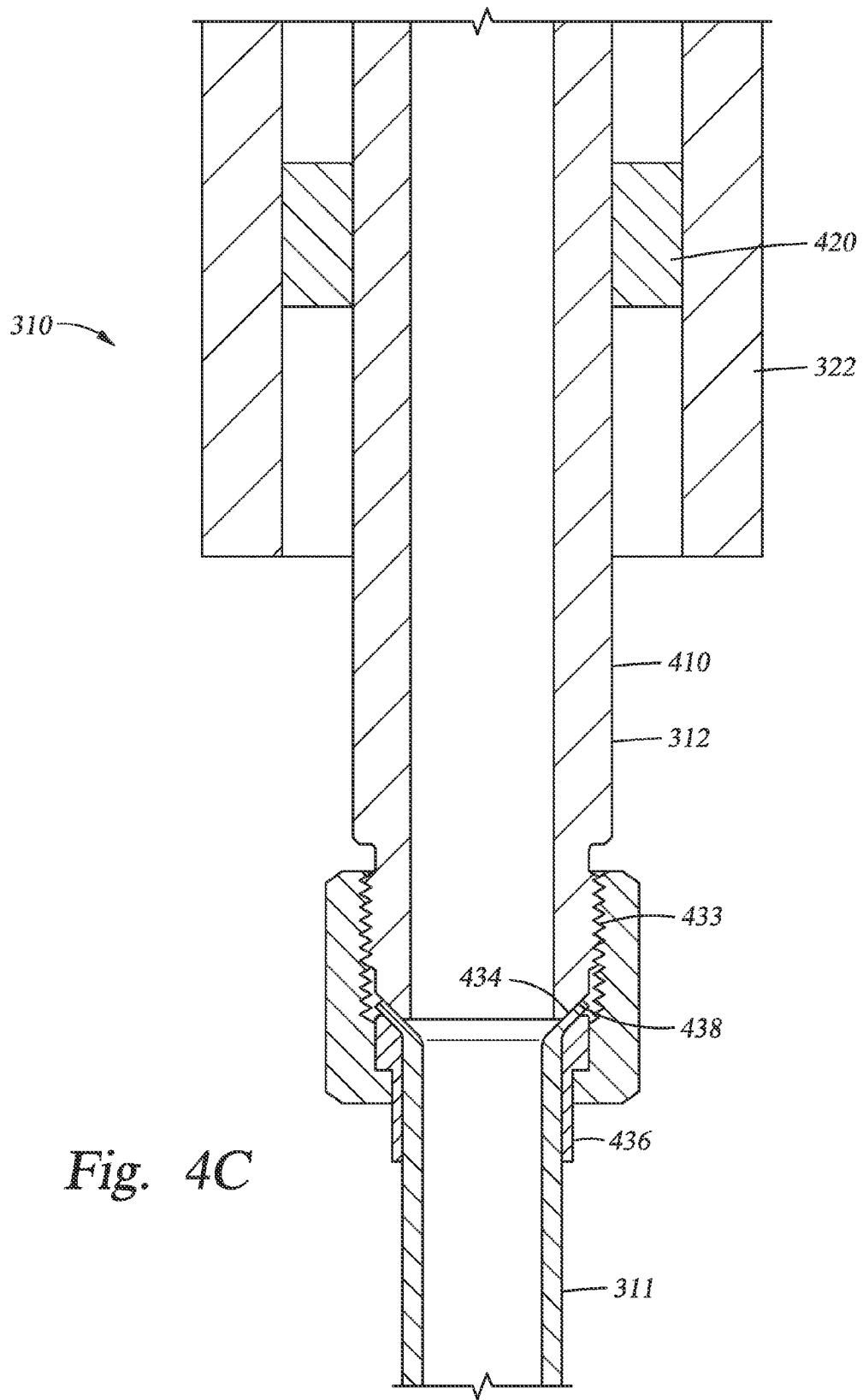
FIG. 4C is a partial schematic cross-sectional representation of an antenna 310 according to one embodiment.

FIG. 4C is a partial schematic cross-sectional view of an antenna 310 according to one embodiment. The antenna 310 includes a first segment 311, a second segment 312, and a dielectric layer 322. The first segment 311 includes a first tapered surface 434 and a gasket 436. The second segment 312 includes an exposed end 410 having a second tapered surface 438. Spacers 420 are disposed between the outer diameter of the second segment 312 and the inner diameter of the dielectric layer 322.

In this embodiment, the first and second segments 311, 312 may be coupled with flared fittings, such as 37° flared fittings (ISO 8434-2; SAE J514). In this embodiment, the first tapered surface 434 may be placed in contact with the second tapered surface 438. The coupling body 432 may then be screwed onto the exposed end 410 of the second segment 312 to form a threading connection 433 between the first segment 311 and the second segment 312. As the threading connection 433 is formed, the coupling body 432 presses the gasket 436 to the flared end of the first segment 311, forming a seal between the coupling body 432, gasket 436, and flared end of the first segment 311.

While the foregoing is directed to embodiments of the present invention, other and further embodiments of the invention may be devised without departing from the basic scope thereof, and the scope thereof is determined by the claims that follow.

The invention claimed is:

1. An apparatus, comprising:
a chamber body having a top and a bottom opposite the top;
a linear antenna comprising:
a first segment extending through the top;
a second segment coupled to the first segment at a location within the top of the chamber body and extending through an interior volume of the chamber body; and
a third segment extending through the bottom, wherein the third segment is coupled to the second segment at a location within the bottom of the chamber body, wherein each of the first segment and the third segment is able to disconnect from the second segment;
at least two gas introduction tubes extending vertically from the bottom to the top, wherein the at least two gas introduction tubes are parallel to the antenna; and
a dielectric layer disposed around an outer diameter of the second segment.

2. The apparatus of claim 1, wherein the antenna comprises a hollow electrically conductive tube adapted to transport a cooling fluid, wherein the hollow electrically conductive tube comprises a hollow copper tube.

3. The apparatus of claim 2, wherein the hollow electrically conductive tube has an outer diameter of about 0.3 inches to 0.5 inches.

4. The apparatus of claim 1, wherein the dielectric layer is disposed around the outer diameter of the second segment, and spacers are coupled between the outer diameter of the antenna and an inner diameter of the dielectric layer.

5. The apparatus of claim 4, wherein the spacers are configured to form a fluid channel between an outside diameter of the antenna and an inside diameter of the dielectric layer, the fluid channel extending along a length of the dielectric layer.

6. The apparatus of claim 1, further comprising:
a first coupling body connecting the second segment to the first segment; and
a second coupling body connecting the second segment to the third segment.

7. The apparatus of claim 1, wherein the first and third segments have a length of at least 0.5 meters, and the second segment has a length of at least 2 meters.

8. The apparatus of claim 1, further comprising a first microwave launcher assembly disposed on the top of the chamber body and electrically coupled to the first segment of the antenna.

9. The apparatus of claim 8, further comprising a second microwave launcher assembly disposed on the bottom of the chamber body and electrically coupled to the third segment of the antenna.

10. The apparatus of claim 1, wherein the dielectric layer comprises alumina.

11. An apparatus, comprising:
a chamber body having a top and a bottom opposite the top;
a linear antenna comprising:
a first segment;
a second segment coupled to the first segment at a location within the top of the chamber body and extending through an interior volume of the chamber body; and
a third segment coupled to the second segment at a location within the bottom of the chamber body, wherein each of the first segment and the third segment is able to disconnect from the second segment;
at least two gas introduction tubes extending vertically from the bottom to the top, wherein the at least two gas introduction tubes are parallel to the antenna; and
a dielectric layer disposed around an outer diameter of the second segment, wherein the first segment extends through the top surface of the chamber body, and the third segment extends through the bottom surface of the chamber body, and the antenna comprises a hollow electrically conductive tube adapted to transport a cooling fluid.

* * * * *